United States Patent [19]

Harima

[11] Patent Number: 5,468,985
[45] Date of Patent: Nov. 21, 1995

[54] SEMICONDUCTOR DEVICE

[75] Inventor: Takayuki Harima, Kawaguchi, Japan

[73] Assignee: Kabushiki Kaisha Toshiba, Kawasaki, Japan

[21] Appl. No.: 234,061

[22] Filed: Apr. 28, 1994

[30] Foreign Application Priority Data

May 1, 1993 [JP] Japan ..................... 5-128184

[51] Int. Cl.⁶ ..................... H01L 27/10; H01L 27/15
[52] U.S. Cl. ..................... 257/385; 257/390; 257/401; 365/214
[58] Field of Search ..................... 365/63, 51, 214; 257/903, 904, 905, 390, 401, 377, 385

[56] References Cited

U.S. PATENT DOCUMENTS

4,782,465  11/1988  Uchida ..................... 365/72
5,172,335  12/1992  Sasaki et al. ..................... 365/63
5,241,495   8/1993  Sasaki ..................... 365/51

*Primary Examiner*—Sara W. Crane
*Assistant Examiner*—Donald L. Monin, Jr.
*Attorney, Agent, or Firm*—Spensley Horn Jubas & Lubitz

[57] ABSTRACT

There is provided a semiconductor device having a wiring configuration which can suppress an increase in the delay time of a wiring extending over the memory cell area even if the cell size is reduced. Wirings of preset wiring length are formed over a semiconductor substrate. A wiring of wiring length larger than that of the former wirings is formed over the former wirings with an inter-level insulation film disposed therebetween and the width of the latter wiring is made large. Thus, the wiring resistance is reduced and the wiring delay time can be effectively reduced. The semiconductor device is applied to a semiconductor memory or the like in which cell selection is made by use of the hierarchical structure such as a duplex word line system.

8 Claims, 8 Drawing Sheets

SEMICONDUCTOR DEVICE

BACKGROUND OF THE INVENTION

1. Field of the Invention

This invention relates to a semiconductor device, and more particularly to a wiring configuration used for permitting high-speed access to a signal line for selecting a memory cell in a memory in which cell selection is made by use of the hierarchical structure such as a duplex word line system.

2. Description of the Related Art

As the integration density is increased and the operation speed of semiconductor devices such as ICs and LSIs is enhanced, a problem of time delay caused by the wirings thereof becomes serious. The delay time (which is hereinafter referred to as wiring delay time) caused by the wiring in the semiconductor device is determined by the product R·C of the total sum C of load capacitances (such as the gate capacitance of the next stage, wiring capacitance) driven by the buffer and the wiring resistance R. The chip size increases with an increase in the memory capacity of the semiconductor device and the wiring length of a signal line is made longer, and therefore, the wiring delay time tends to become longer. When the size of the memory cell is reduced as the integration density of the semiconductor device is increased, the wiring width of the signal line extending over the memory cell must be reduced accordingly, and in this case, the distance between the adjacent wirings becomes short. Under this condition, the wiring delay time is increased. Further, as the time of access to the memory is made short, the rate of the wiring delay time determining the total access time becomes larger than in the conventional case. Thus, the wiring delay time cannot be neglected when an attempt is made to attain the high-speed operation. In order to suppress the wiring delay time, it is required to increase the wiring width and the space between the wirings.

Figure 1:
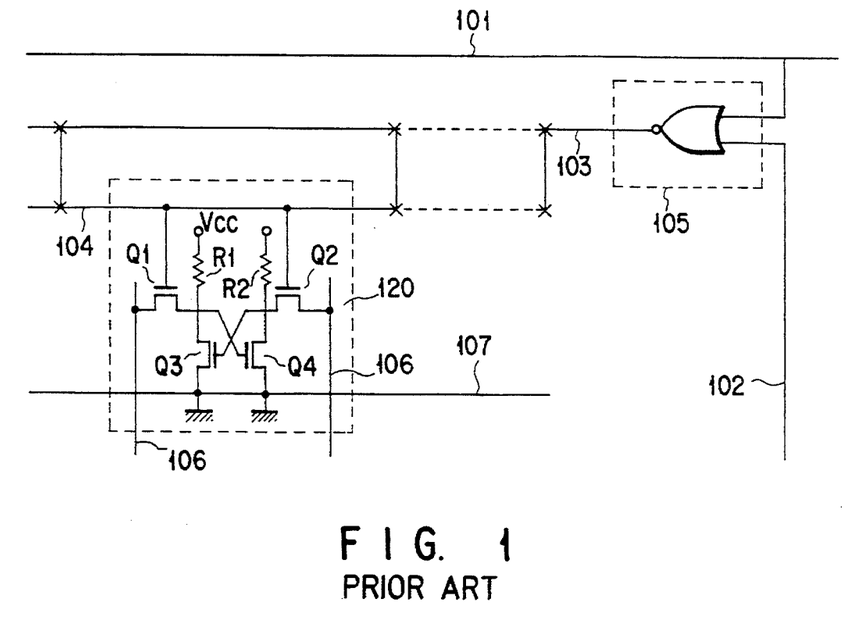
FIG. 1 is a detailed circuit diagram of one unit of an SRAM.

Next, the conventional semiconductor device is explained by taking a static random access memory (SRAM) as an example to explain the problem of the wiring delay time. The SRAM is constructed by a memory cell array having memory cells arranged in a matrix form with a preset capacity, a row selection decoder and column selection decoder for selecting a desired memory cell, and a circuit for controlling input/output of data. As the element structure of the SRAM, a 6-transistor element such as a CMOS type element and E/D type element using depletion transistors as load elements is known in the prior art, however recently, resistance-load type elements having polysilicon resistors as high-resistance load elements are widely used. As shown in FIG. 1, since the high-resistance load type element (E/R type element) is a 4-transistor (Q1 to Q4) element and the resistance elements R1 and R2 of polysilicon can be laid over the upper layer of the MOS transistor, the cell occupied area can be reduced. A pair of transfer MOS transistors Q1, Q2 using the gate line as the gate input line are connected to respective storage nodes and read/write data transfer is effected between the memory cell and the data line via the transfer MOS transistors. The word line is connected to the output line of the row selection decoder and is formed by patterning a polysilicon layer which is the same as a polysilicon layer forming the gate electrode in the same step of forming the gate electrode, and the potential thereof is set at the "1" level to turn ON the transfer MOS transistors only when the memory cell 120 is selected.

Figure 2:
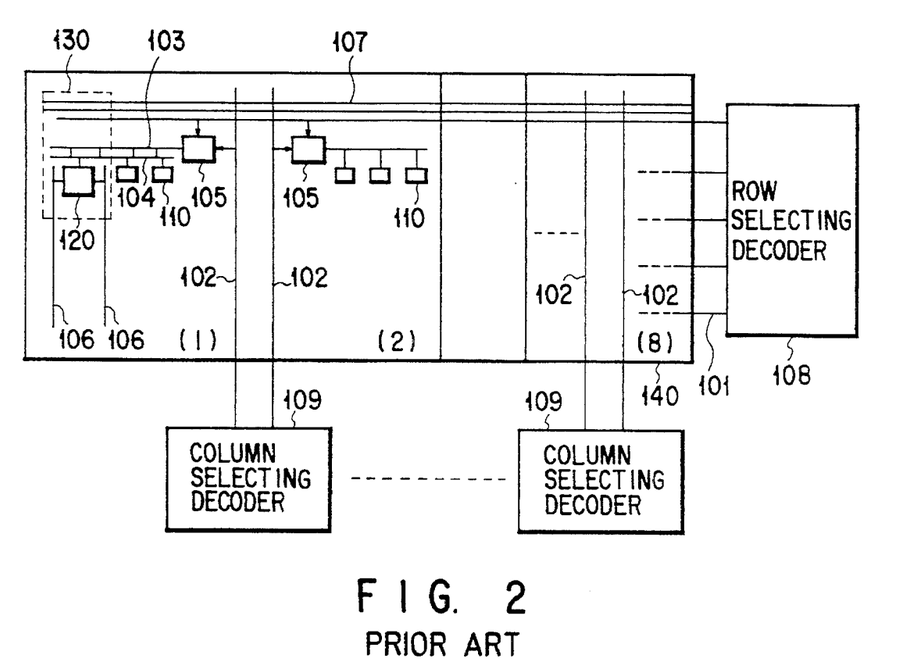
FIG. 2 is a circuit diagram of an SRAM system.

A pair of data lines 106 are previously set at the same voltage level before the memory cell 120 is selected, so that data of a memory cell selected by the present address input can be protected and prevented from being erroneously written into a memory cell which will be selected by a next address input. In the case of write-in cycle, data transferred to the pair of data lines 106 according to data of the accessed memory cell 120 is written into the memory cell 120 via the transfer MOS transistors Q1, Q2 of the memory cell 120. The SRAM is so constructed as to select a desired memory cell from the memory cell array by driving the row decoder and column decoder and is variously designed to attain the high integration density, high-speed operation and low power consumption. In the SRAM, a stationary current flows from the data line load MOS transistor into all of the memory cells which are connected to a single word line via the transfer MOS transistors and driving MOS transistors at the time of readout or write-in for the memory cell. In order to reduce the stationary current at the time of operation, there is an approach in which the memory cell array is divided into a plurality of memory cell blocks by use of an address signal to reduce the number of memory cells connected to each of the word lines. For example, as shown in FIG. 2, the word line can be divided into small sections and the number of memory cells connected to each divided word line can be reduced by dividing the memory cells 120 into eight blocks (1) to (8) in the column direction and effecting the row selection for each block unit. FIG. 2 shows a row selection decoder 108, an assembly of a plurality of blocks of the memory cell array constructed by memory cells 120 selected by the row selection decoder, and a memory cell area 130.

Figure 3:
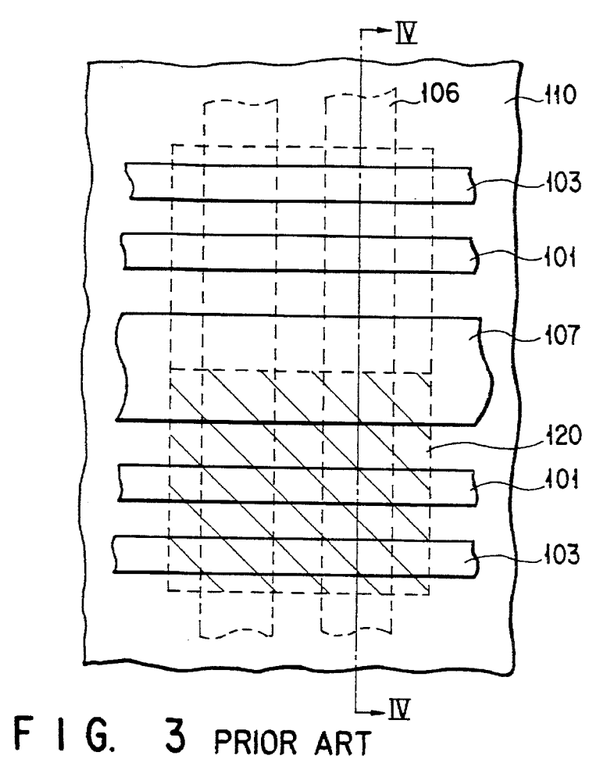
FIG. 3 is a plan view showing a conventional semiconductor device.
Figure 4:
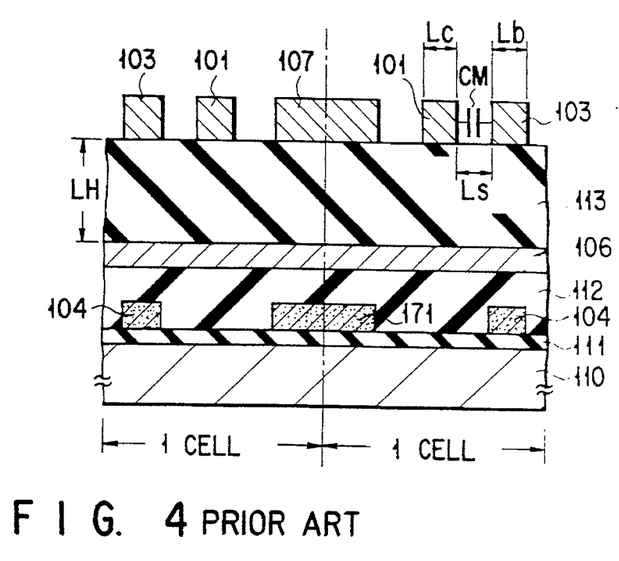
FIG. 4 is a cross sectional view taken along the line IV—IV of FIG. 3.

The positional relation of the wirings of the SRAM on the semiconductor substrate is explained with reference to FIGS. 3 and 4. FIG. 3 is a plan view showing part of wirings on the semiconductor substrate and FIG. 4 is a cross sectional view taken along the line IV—IV of FIG. 3. The wirings used as signal lines, for example, are formed to extend over the memory cell area formed on the semiconductor substrate 110. Gate electrodes (not shown) of transistors constituting memory cells and second row selection lines 104 and memory cell ground potential line 171 which are formed of polysilicon are formed on an insulation film 111 on the semiconductor substrate formed of silicon, for example. The polysilicon wirings are covered with an insulation film 112 formed of silicon oxide, for example, and the insulation film 112 is made flat. Data lines 106 formed of wirings of a first metal wiring layers of Al, for example, for transferring data are formed on the insulation film. An insulation film 113 formed of silicon oxide, for example, is formed to cover the data lines 106 and is made flat. Wirings of a second metal wiring layers of Al, for example, are formed on the flattened surface of the insulation film 113 to intersect the data lines 106 at substantially right angles. The wirings of the second metal wiring layer are laid above memory cells 120 and are used as first row selection lines 101 of the memory cell array, shunt lines 103 of the second row selection lines 104 selected by the first row selection lines 101 and column selection lines 102, and shunt lines 107 for lowering the resistance of the memory cell ground potential lines 171.

The first row selection lines 101 are disposed adjacent to the respective shunt lines 103 of the second row selection lines 104. Further, the wirings 106 of the first metal wiring layers are electrically isolated from the wirings 101, 103 and 107 of the second metal wiring layers by means of the insulation film 113. All of the wirings of the first and second metal wiring layers are disposed in one memory cell area 130 constructed by a memory cell and wirings, and as the memory size is reduced, the width of and the space between the wirings of the first and second metal wiring layers are reduced. As a result, the wiring resistance and the wiring capacitance are increased to further increase the wiring delay time. Particularly, the delay time becomes significant in the first row selection line 101 whose wiring length is large and which is formed of the wiring of the second metal wiring layer and disposed over the entire length of the memory cell array in the row direction thereof. Since the shunt lines 103 of the second row selection lines are divided for each column, the wiring length thereof is small and the delay time therein is not so long. Although not shown in the drawing, the second row selection line 104 is electrically connected to the shunt line 103 and the memory cell ground potential line 171 is electrically connected to the shunt line 107.

Figure 5:
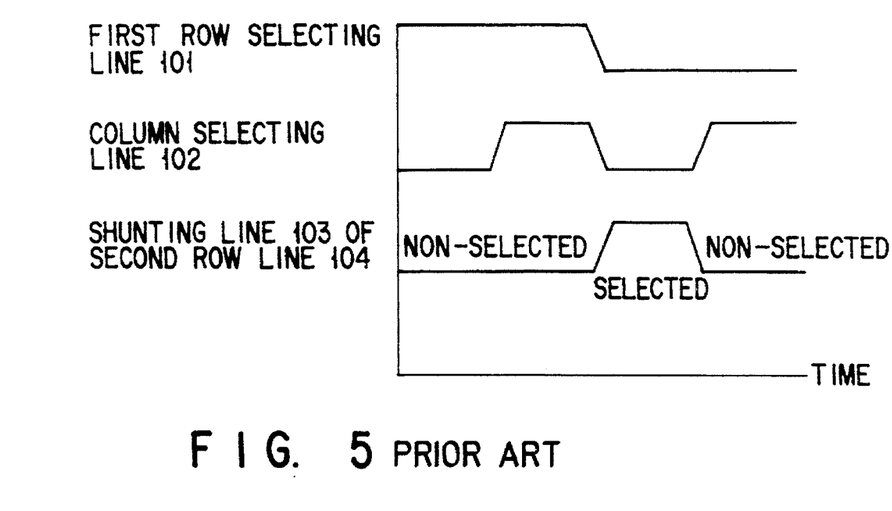
FIG. 5 is a signal characteristic diagram showing signals input/output when the intermediate buffer of the SRAM of FIG. 1 is a NOR circuit.

As the integration density of the semiconductor device is enhanced, the wiring width Lc of the first row selection line 101 and the wiring width Lb of the shunt line 103 of the second row selection line are reduced to increase the resistances thereof as shown in FIG. 4, for example, and the wiring interval Ls between the wirings 101 and 103 of the second metal wiring layer, that is, the space between the first row selection line 101 and the shunt line 103 is also reduced, and as a result, the capacitance CM between the wirings increases to make the wiring delay time of the semiconductor device long. Further, since the selection/non-selection mode of the first row selection line 101 and the shunt line 103 of the second row selection line 104 is set as shown in FIG. 5, the shunt line of the second row selection line is selected by use of the first row selection line 101 and the column selection line 102 when a NOR circuit 105 is used as the intermediate buffer. For this reason, signals in the first row selection line 101 and the second row selection line 104 in the cell selection state of the memory cell are set in the inverted relation. Therefore, the capacitance between the adjacent wirings is increased and the Miller effect becomes significant. As a result, the wiring delay time of the first row selection line 101 becomes long.

It is possible to reduce the wiring length of the first row selection line 101 of the second metal wiring layer by changing the memory cell array structure and increasing the number of memory cells connected to the data lines 106 of the first metal wiring layer, but the time delay effect in the data lines contained in the first metal wiring layer is larger and the substantially improved effect of reduction in the access time cannot be attained. Thus, as the integration density of the semiconductor device is more enhanced and the cell size is more reduced, it becomes more difficult to suppress an increase in the delay time of the wiring passing the memory cell area.

SUMMARY OF THE INVENTION

This invention has been made to solve the above problem, and an object of this invention is to provide a semiconductor device having a wiring structure which makes it possible to suppress an increase in the delay time of the wiring passing the memory cell area even when the cell size is reduced.

In a semiconductor device having wirings of preset wiring length formed on a semiconductor substrate and wirings of wiring length larger than that of the former wiring, the wiring of the larger wiring length is formed above or below the wiring of the preset wiring length with an insulation film disposed therebetween and the wiring width of the wiring of the larger wiring length is made larger than that of the wiring of the preset wiring length. That is, the semiconductor device of this invention has a first feature that it comprises a semiconductor substrate; a plurality of memory cells formed on the semiconductor substrate; first row selection lines formed over the semiconductor substrate, for transmitting a signal from a row selection decoder; column selection lines formed over the semiconductor substrate, for transmitting a signal from a column selection decoder; second row selection lines formed over the semiconductor substrate and connected to the plurality of memory cells; shunt lines formed over the semiconductor substrate, for lowering the resistances of the respective second row selection lines; an intermediate buffer for selecting the second row selection line via the shunt line based on signals from the first row selection lines and the column selection lines; a first metal wiring layer formed over the semiconductor substrate; a second metal wiring layer formed over the first metal wiring layer with an insulation film disposed therebetween and having wirings used as at least the shunt lines of the second row selection lines; and a third metal wiring layer formed over the second metal wiring layer with another insulation film disposed therebetween and having wirings used as at least the first row selection lines; wherein the wiring width of the first row selection line is made larger than that of the shunt line of the second row selection line.

The wirings of the first metal wiring layer can be used as data lines for transmitting memory cell data. The second metal wiring layer can be formed to have wirings of preset wiring width, and the third metal wiring layers can be formed to have wirings of wiring width larger than the wiring width of the wiring of the preset wiring width. The wiring length of the first row selection line can be made larger than the wiring length of the shunt line of the second row selection line. The shunt lines of the second row selection lines can be deviated from each other in the upper and lower positions without disposing the first row selection line of the third metal wiring layer directly above the shunt line of the second row selection line of the second metal wiring layer. Further, the semiconductor device has a second feature that it comprises a semiconductor substrate; a plurality of memory cells formed on the semiconductor substrate; first row selection lines formed over the semiconductor substrate, for transmitting a signal output from a row selection decoder; column selection lines formed over the semiconductor substrate, for transmitting a signal from a column selection decoder; second row selection lines formed over the semiconductor substrate and connected to the plurality of memory cells; shunt lines formed over the semiconductor substrate, for lowering the wiring resistances of the respective second row selection lines; an intermediate buffer for selecting one of the second row selection lines via a corresponding one of the shunt lines based on signals from the first row selection lines and the column selection lines; a first metal wiring layer formed over the semiconductor substrate; a second metal wiring layer formed over the first metal wiring layer with an insulation film disposed therebetween and having wirings used as at least the shunt lines of the second row selection lines; and a third metal wiring layer formed below the second metal wiring layer and above the first metal wiring layer with other insulation films disposed therebetween and having wirings used as at least the first row selection lines; wherein the wiring width of the first row selection line is made larger than that of the shunt line of the second row selection line.

Further, the semiconductor device of this invention has a third feature that it comprises a semiconductor substrate; a first metal wiring layer formed over the semiconductor substrate and having wirings of preset wiring length; and a second metal wiring layer formed above or below the first metal wiring layer above the semiconductor substrate and having wirings of wiring length larger than that of the wiring of the preset wiring length; wherein the wiring width of the wiring of the second metal wiring layer is made larger than that of the wiring of the preset wiring length of the first metal wiring layer.

Since the wiring of large wiring length is formed with large wiring width, the wiring delay time can be effectively reduced. Further, in a case where this invention is applied to a memory in which a memory cell is selected by use of the hierarchical structure such as a duplex word line system, the first row selection line and the shunt line of the second row selection line selected by the first row selection line and the column selection line are disposed adjacent to each other as the wirings extending in the row direction of the memory cells and formed of the wirings of the second metal wiring layer arranged over the data lines which are formed of the wirings of the first metal wiring layers for transmitting memory cell data, the first row selection line of large wiring length formed over the entire length of the memory cell array in the row direction thereof is selected from the wirings of the third metal wiring layer disposed above the second metal wiring layer, and the wiring width of the wiring is made larger than that of the shunt line of the second row selection line which has a smaller wiring length because it is divided for each column to effectively reduce the resistance thereof so as to reduce the delay time. Further, a capacitance between the first row selection line and the shunt line of the second row selection line can be suppressed to reduce the Miller effect and suppress an increase in the wiring delay time by making the thickness of the insulation film between the second metal wiring layer and the third metal wiring layer larger than the minimum wiring distance between the wirings of the second metal wiring layer and disposing the third metal wiring layer in position deviated from the position directly above the wiring position of the second metal wiring layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

There will now be described an embodiment of this invention with reference to the accompanying drawings.

Figure 6:
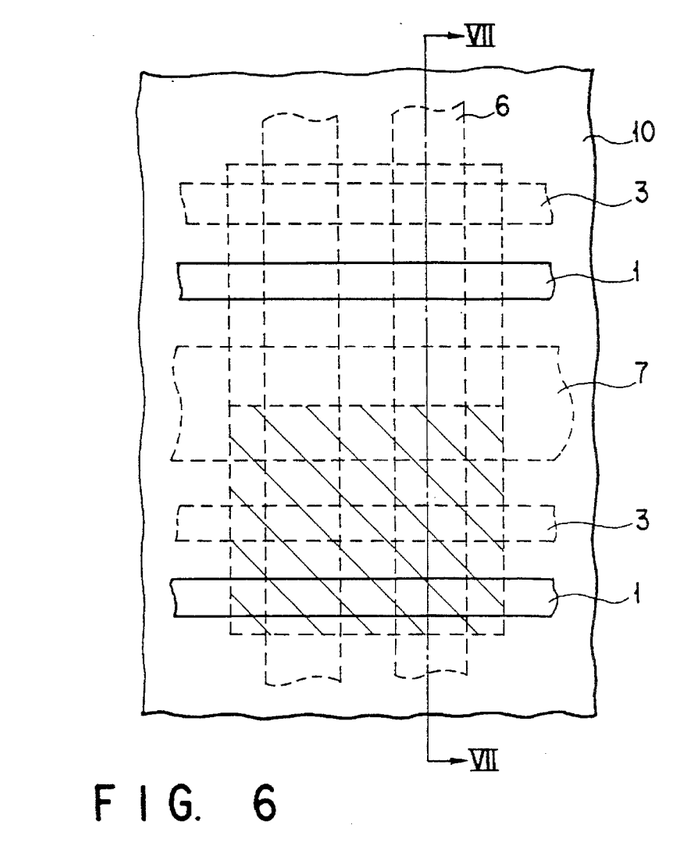
FIG. 6 is a cross sectional view of a semiconductor device according to a first embodiment of this invention.
Figure 7:
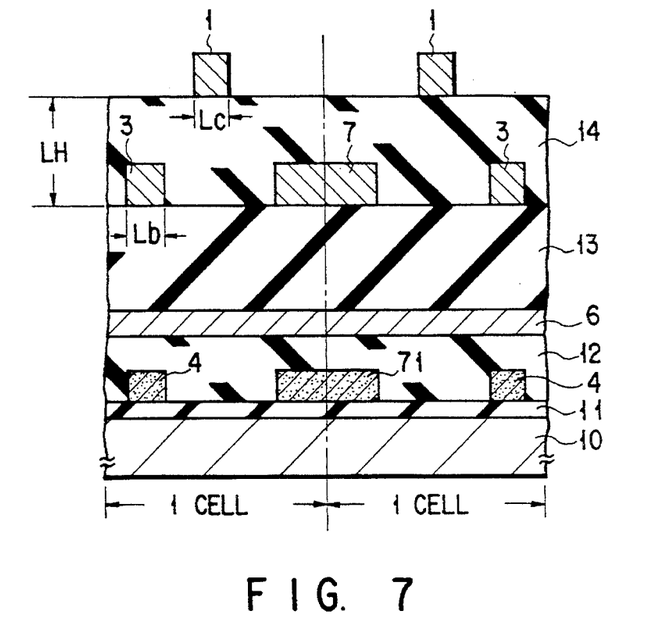
FIG. 7 is a plan view of the semiconductor device according to the first embodiment of this invention.
Figure 8:
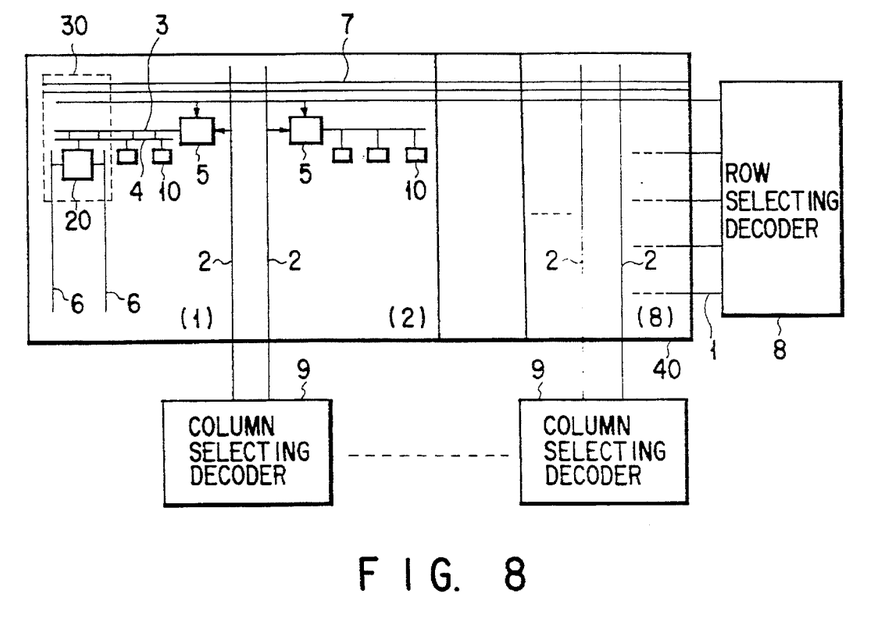
FIG. 8 is a detailed circuit diagram of one unit of an SRAM.
Figure 9:
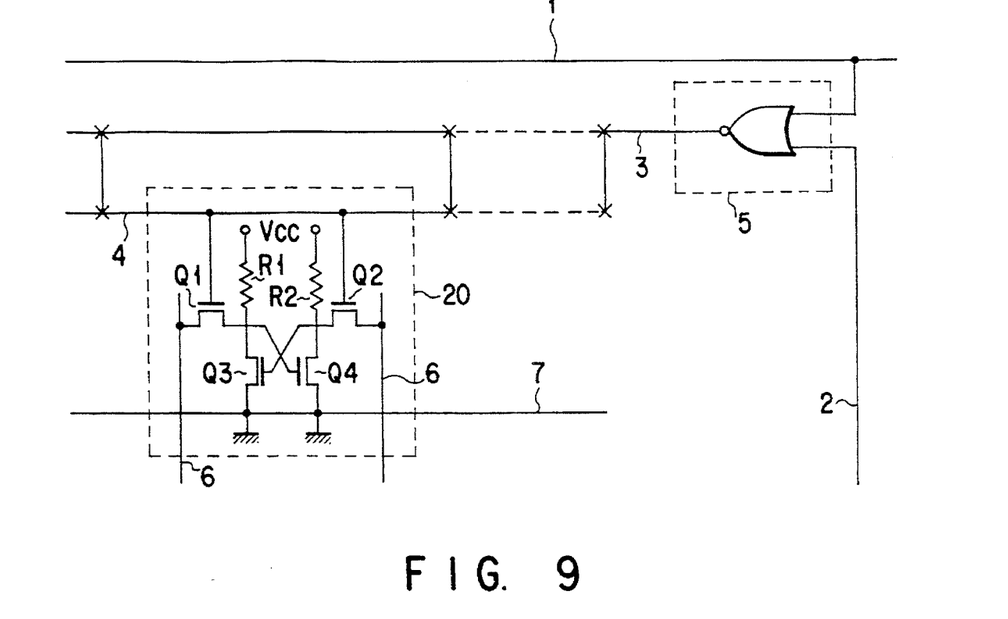
FIG. 9 is a circuit diagram of an SRAM system.
Figure 10:
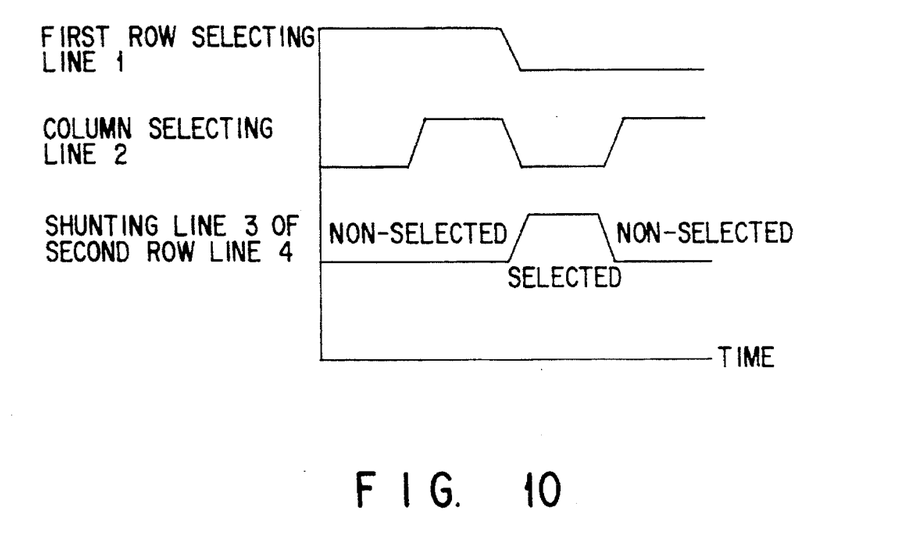
FIG. 10 is a signal characteristic showing signals input/output when the intermediate buffer of the SRAM of FIG. 8 is a NOR circuit.

First, a semiconductor device of a first embodiment is explained with reference to FIGS. 6 to 10. In this embodiment, the semiconductor device is explained by taking an SRAM as an example. FIG. 6 is a plan view of the SRAM, FIG. 7 is a cross sectional view taken along the line VII—VII of FIG. 6, FIG. 8 is a partially enlarged schematic diagram showing the concrete structure of a memory cell area 30 including wirings, intermediate buffer 5 and memory cell 20, FIG. 9 is a plan view showing the wiring of the SRAM system in detail and FIG. 10 is a characteristic diagram showing a variation of a signal for selecting a selection/non-selection mode of the shunt lines 3 of the second row selection lines 4 by use of the intermediate buffer 5 shown in FIG. 8 with time. The SRAM used here is so designed that a desired one of the memory cells 20 can be selected from the memory cell array by driving the row selection decoder 8 and the column selection decoder 9. In the construction shown in FIG. 9, the number of memory cells connected to each word line can be reduced by dividing the memory cells 20 into eight blocks (1) to (8) in the column direction and effecting the row selection for each block unit. As shown in FIG. 9, the row selection decoder 8 and column selection decoder 9 are respectively connected to a plurality of first row selection lines 1 and a plurality of column selection lines 2.

Each of the first row selection lines 1 is connected to shunt lines 3 of a plurality of second row selection lines via a corresponding one of intermediate buffers 5 and the shunt line 3 is electrically connected to the second row selection line 4 formed of a polysilicon wiring. Each of the second row selection lines 4 is connected to a plurality of memory cells 20. The first row selection line 1 and the column selection line 2 are connected to inputs of the intermediate buffer 5 whose output is connected to the second row selection line 4. Since the second row selection line (word line) 4 is formed of a polysilicon film which is used to form the gate electrode of an element constituting the memory cell, the wiring resistance becomes large, thereby making the delay time long. For this reason, the output of the intermediate buffer 5 is connected to the shunt line 3 of the second row selection line. In FIG. 8, one row selection decoder, an assembly 40 of a plurality of blocks of the memory cell array constructed by memory cells selected by the row selection decoder, and a memory cell area 30 in the assembly are shown. As shown in FIG. 8, the shunt line 7 is connected to the ground potential line which is connected to the memory cell 20. The assembly 40 is divided into eight blocks (1) to (8) and each block is connected to a corresponding one of the column selection lines 2 which are connected to the respective column selection decoders 9.

In FIG. 8, the memory is of resistance-load type having four elements. The second row selection line 4 is connected to the gate of the transfer MOS transistors Q1, Q2 of the memory cell 20 and the shunt line 7 of the ground potential line is connected to driving MOS transistors Q3, Q4 via the ground potential line. The shunt line 7 is arranged to extend in the row direction so as to reduce the resistance of the ground potential line. The first memory cell area 30 is indicated by broken lines in the memory cell array in the block (1) as shown in FIG. 9. In this area, the memory cell 20 is formed and a pair of data lines (bit lines) 6 are arranged in the area. The data lines 6 are connected to the respective transfer MOS transistors.

With the above SRAM, $21^1$ memory cells can be arranged for one of the first row selection lines of one row selection decoder. The resistance-load type memory having four elements has high-resistance resistors R1 and R2 formed of polysilicon and connected to the power source voltage (Vcc). An output signal of the row selection decoder 8 for selecting a desired row of the memory cell array and an output signal of the column selection decoder 9 for selecting a desired column of the memory cell array are input to a desired one of the intermediate buffers 5 arranged in the row direction via the first row selection line 1 and the column selection line 2, respectively, according to an externally supplied address input signal (not shown) so as to select the shunt line 3 of the second row selection line to which the output of the intermediate buffer 5 is connected. Data from the memory cell 20 connected to the second row selection line 4 which is connected to the selected shunt line 3 is supplied via the data lines 6 which are connected to the respective memory cells.

Next, a case wherein the second row selection line 4 of FIG. 9 is selected is explained with reference to FIG. 10. Output signals of the row selecting decoder 8 and the column selecting decoder 9 are supplied to the first row selection line 1 and column selection line 2, respectively, and therethrough supplied to the intermediate buffer 5. Since a NOR circuit is used as the intermediate buffer 5, the shunt line 3 of the second row selection line 4 is set into the selection state when low level signals are supplied to the first row selection line 1 and column selection line 2. Of course, the intermediate buffer is not limited to the NOR circuit. For example, another circuit such as an AND circuit can be used. In this case, the shunt line of the second row selection line is set into the selection state when high level signals are supplied to the first row selection line and column selection line.

Next, the positional relation of the wirings of the SRAM on the semiconductor substrate is explained with reference to FIGS. 6 and 7. Wirings used for the signal lines, power source lines, etc., are formed to extend over the memory cell area formed in the semiconductor substrate. The second row selection lines 4 and memory cell ground potential line 71 which are formed of polysilicon are formed together with gate electrodes (not shown) of transistors constructing memory cells on an insulation film 11 formed on the semiconductor substrate 10 which is formed of silicon semiconductor or the like. The polysilicon wirings are covered with an insulation film 12 formed of silicon oxide or the like and the insulation film 12 is made flat. A first metal wiring layer having wirings formed of Al or aluminum alloy such as Al—Si, Al—Si—Cu, for example, is formed on the flat surface of the insulation film and data lines 6 for transferring memory cell data are formed by use of the wirings of the first metal wiring layer. An insulation film 13 formed of silicon oxide with a film thickness of approx. 10,000 angstrom is formed to cover the data lines 6 and then made flat. After this, a second metal wiring layer having wirings formed of Al or aluminum alloy such as Al—Si, Al—Si—Cu, for example, is formed on the flat surface of the insulation film 13 to intersect the data lines 6 at substantially right angles.

The shunt lines 3 of the row selection lines selected by the first row selection lines 1 and column selection lines 2 and the shunt lines 7 for lowering the resistance of the memory cell ground potential lines are formed above the respective memory cells by use of the wirings of the second metal wiring layer. An insulation film 14 formed of silicon oxide with a film thickness (LH) of 20,000 to 30,000 angstrom is formed to cover the second metal wiring layer and then the insulation film is made flat. Next, wirings of a third metal wiring layer formed of Al or aluminum alloy such as Al—Si, Al—Si—Cu are formed in parallel with the wirings of the second metal wiring layer on the flat surface of the insulation film 14 and the first row selection lines 1 are formed in parallel with the wirings of the second metal wiring layer by use of the wirings of the third metal wiring layer. After this, the third wiring layer is covered with and protected by an insulation film (not shown). In this embodiment, the memory cell ground potential line is formed of the same polysilicon film as that used for forming the gate electrodes of the transistors constructing the memory cell, but it is also possible to form a second polysilicon film on the above polysilicon film with an inter-level insulation film disposed therebetween and pattern the second polysilicon film to form the memory cell ground potential line 3. The first to third metal wiring layers may be formed of the same material as described above or can be formed of different materials.

The shunt line 3 is connected to the second metal wiring layer 4 of polysilicon wiring layer or the like with one layer disposed therebetween by use of the ordinary manufacturing technique, for example, the anisotropic etching such as RIE. The lines are connected to each other at a plurality of portions, and for this purpose, openings are formed in the insulation films 12, 13 and conductive films are filled in the openings. The insulation film 12 is selectively etched to form a plurality of contact holes therein and expose the polysilicon film which serves to form the second row selection lines 4. Then, the first metal wiring layer is patterned on the insulation film 12 by use of an ordinary method such as the etching technique to form wirings in positions including the inner portions of the contact holes so as to connect the first metal wiring layer to the polysilicon film 4 via the contact holes. Next, the insulation film 13 is formed, and a plurality of via-holes are formed in the insulation film 13 to expose the first metal wiring layer. Then, the second metal wiring layer is patterned on the insulation film 13 to form the shunt lines 3 in positions including the inner portions of the via-holes so as to connect the shunt line 3 to the first metal wiring layer via the via-holes. Thus, the shunt lines 3 are respectively connected to the second row selection lines 4 via the first metal wiring layer. In this embodiment, as the conductive films to be filled in the openings such as the via-holes and contact holes, the metal wiring layer formed on the openings is used, but it is also possible to selectively grow metal such as W or Mo in the openings and use the same as the connection conductive film.

In the wiring configuration on the semiconductor substrate, the shunt lines 3 of the second row selection lines formed by use of the wirings of the second metal wiring layer are divided for each column of the memory cells and therefore the wiring length thereof is short. The main factor for making the delay time of the second row selection line large is that the material of the wiring is polysilicon. Further, since the first row selection line 1 formed by use of the wiring of the third metal wiring layer above the second metal wiring layer is formed over the entire length of the memory cell array in the row direction thereof, the wiring length thereof is larger than the wiring length of the shunt line 3 of the second row selection line. This invention has a feature that a plurality of wirings which are formed by use of one metal wiring layer in the prior art are divided into wirings of large wiring length and wirings of short wiring length, and the wirings of large wiring length are formed by use of a metal wiring layer formed above the former metal wiring layer, and in this embodiment, the first row selection lines 1 are formed by use of the wirings of the third metal wiring layer formed above the second metal wiring layer as the wirings of large wiring length. Since the number of metal wiring layers is increased by one, the wirings can be arranged in a larger area, the space between the wirings of the respective metal wiring layers can be made large, and the wiring width of the desired wirings of larger wiring length can be made larger than that of the other wirings. More specifically, the wiring width Lc of the first row selection line 1 of the third metal wiring layer is made larger than that of the conventional case while the wiring width Lb of the shunt line 3 of the second row selection line of the second metal wiring layer is kept unchanged. That is, Lb=Lc in the conventional case and Lb<Lc in this embodiment.

Since the shunt lines 3 and first row selection lines 1 are formed by use of different metal wiring layers, the capacitance CM between the wirings depends on the film thickness LH of the insulation film 14 formed as the inter-level insulation film between the second and third metal wiring layers. In order to reduce the capacitance CM, the film thickness LH of the inter-level insulation film may be increased and the distance between the first row selection line 1 and the shunt line 3 may be made longer than the wiring space Ls between wirings of the second metal wiring layer (LH>Ls). Further, the other feature of this embodiment is the arrangement of the first row selection line 1 formed by use of the third metal wiring layer. The row selection line is not simply formed by use of the third metal wiring layer which is formed above the second metal wiring layer but is disposed in position which does not lie directly above the shunt lines 3 and 7. That is, the first row selection line 1 is formed on that portion of the insulation film 14 which lies between the shunt line 7 of the ground potential line and the shunt line 3 of the second row selection line. With this structure, the distance between the first row selection line 1 and the shunt line 3 of the second row selection line is larger than the film thickness LH of the inter-level insulation film so that the capacitance between the wirings can be made smaller than that of a case wherein the first row selection line is disposed directly above the shunt line 3 or the like and the Miller effect caused by setting the first row selection line 1 and the shunt line 3 in the inverted relation at the time of selection of the memory cell can be suppressed.

Next, a second embodiment is explained with reference to FIGS. 11 and 12.

Figure 11:
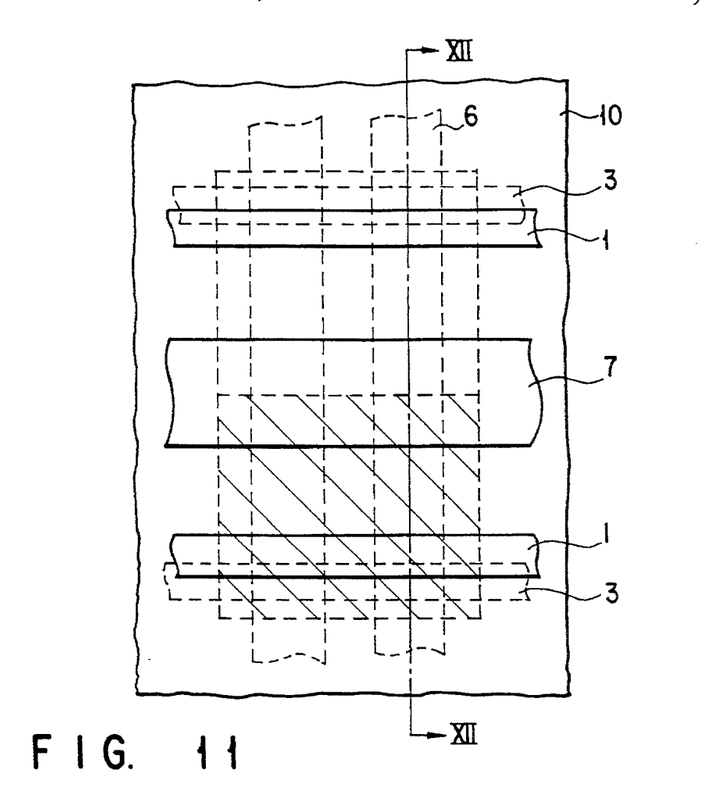
FIG. 11 is a plan view of a semiconductor device according to a second embodiment of this invention.
Figure 12:
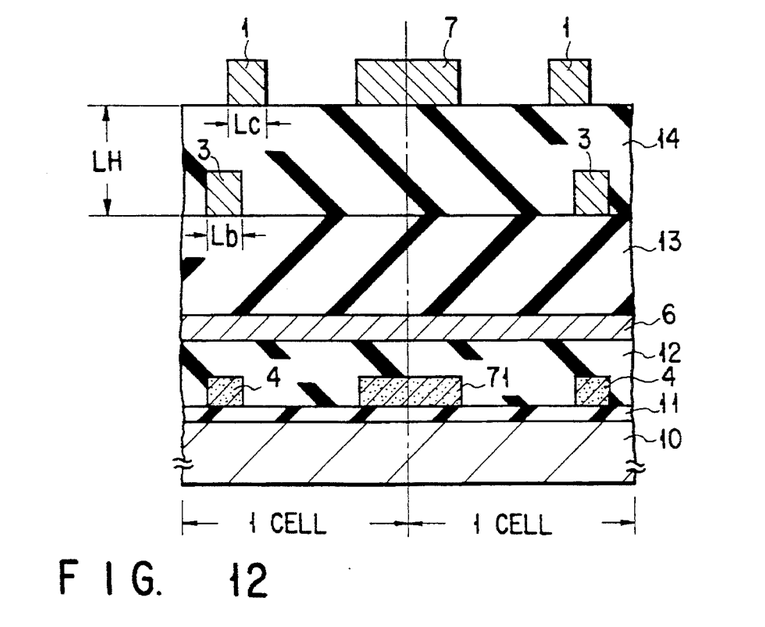
FIG. 12 is a cross sectional view taken along the line XII—XII of FIG. 11.

FIGS. 11 and 12 mainly show the positional relation of the wirings of the SRAM on the semiconductor substrate according to this embodiment, FIG. 11 is a plan view and FIG. 12 is a cross sectional view taken along the line XII—XII of FIG. 11. Wirings used as signal lines, power source liner, etc., on the semiconductor substrate 10 are formed to extend over the memory cell area. The gate electrodes (not shown) of transistors constructing the memory cell and second row selection lines 4 and memory cell ground potential lines 71 which are formed of polysilicon are formed on an insulation film 11 formed on the semiconductor substrate 10. The polysilicon wirings are covered with an insulation film 12 which is made flat, a first metal wiring layer of Al or the like is formed on the insulation film, and data lines 6 for transferring memory cell data are formed by use of the metal wiring layer. Then, an insulation film 13 which is made flat is formed to cover the data lines 6. Wirings of a second metal wiring layer of Al or the like are formed to intersect the data lines 6 at substantially right angles on the flat surface of the insulation film 13. Shunt lines 3 of the second row selection lines selected by the first row selection lines and the column selection lines 2 are formed above the memory cells by use of the second metal wiring layer.

An insulation film 14 which is made flat is formed to cover the second metal wiring layer. Then, wirings of a third metal wiring layer of Al or the like are formed in parallel with the wirings of the second metal wiring layer on the flat surface of the insulation film 14 and first row selection lines 1 are formed in parallel with the wirings of the second metal wiring layer by use of the third metal wiring layer. After this, the third metal wiring layer is covered with and protected by an insulation film (not shown). With the wiring structure on the semiconductor substrate, since the shunt lines 3 of the second row selection lines formed by use of the second metal wiring layer are divided for each column of the memory cells, the wiring length thereof is short. The reason why the shunt line must be formed for the second row selection lines 4 is that the wiring material thereof is polysilicon and the resistance thereof becomes large to increase the delay time (psAl is 50 mΩ/□, for example, and pspolySi is approx. 10 Ω/□) if the shunt lines are not used. Further, since the first row selection lines 1 formed by use of the third metal wiring layer which lies above the second metal wiring layer are formed to extend over the entire length of the memory cell array in the row direction, the wiring length thereof is made larger than that of the shunt line 3 of the second row selection line. In this embodiment, shunt lines 7 for lowering the resistance of the memory cell ground potential lines are formed also by use of the third metal wiring layer.

Since the wirings of large wiring length can be separately disposed, the resistance thereof can be lowered by forming the wirings by use of the metal wiring layer and increasing the wiring width thereof. The wiring width Lc of the first row selection line 1 of the third metal wiring layer is made larger than that of the conventional case while the wiring width Lb of the shunt line 3 of the second row selection line of the second metal wiring layer is kept unchanged. That is, Lb=Lc in the conventional case and Lb<Lc in this embodiment. Since the shunt lines 3 and first row selection lines 1 are formed by use of different metal wiring layers, the capacitance CM between the wirings depends on the film thickness LH of the insulation film 14 formed as the inter-level insulation film between the second and third metal wiring layers. In order to reduce the capacitance CM, the film thickness LH of the inter-level insulation film may be increased and the distance between the first row selection line 1 and the shunt line 3 may be made longer than the wiring space between wirings of the second metal wiring layer. Further, the other feature of this embodiment is the arrangement of the first row selection lines 1 formed by use of the third metal wiring layer. In this embodiment, the row selection line is formed so as to be only partly above the shunt line 3. That is, part of the first row selection line 1 is formed on that portion of the insulation film 14 which lies in a position deviated from the position directly above the shunt line 3 of the second row selection line. With this structure, the distance between the first row selection line 1 and the shunt line 3 of the second row selection line is larger than the film thickness LH of the inter-level insulation film so that the capacitance CM between the wirings can be made smaller than that of a case wherein the first row selection line 1 is disposed directly above the shunt line 3 or the like and the Miller effect caused by setting the first row selection line 1 and the shunt line 3 in the inverted relation at the time of selection of the memory cell can be suppressed.

Next, a third embodiment is explained with reference to FIG. 13.

Figure 13:
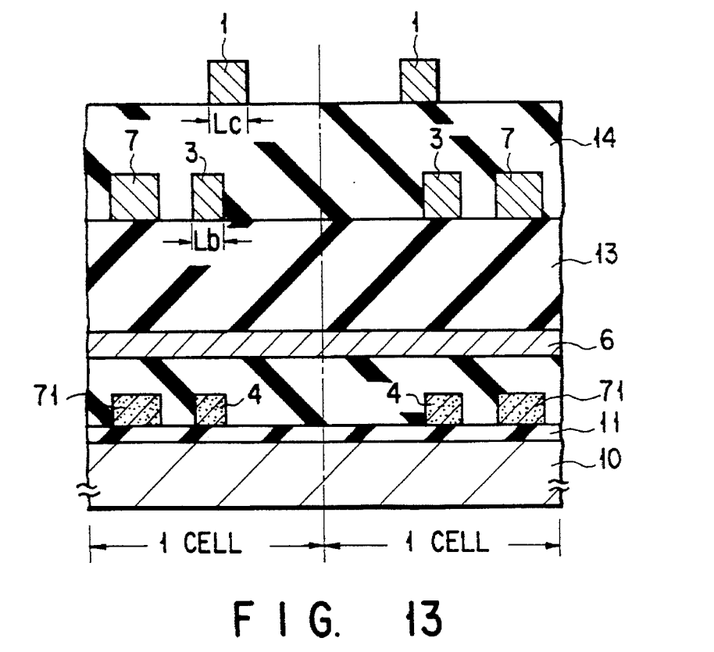
FIG. 13 is a cross sectional view of a semiconductor device according to a third embodiment of this invention.

FIG. 13 is a cross sectional view mainly showing the positional relation of the wirings of the SRAM on the semiconductor substrate according to this embodiment. The wiring structure on the semiconductor substrate 10 obtained by forming data lines 6 for transferring memory cell data by use of the first metal wiring layer of Al or the like and forming the insulation film 13 which is made flat to cover the data lines 6 is the same as that in the former two embodiments. Then, wirings of a second metal wiring layer of Al or the like are formed on the flat surface of the insulation film 13 to intersect the data lines 6 at substantially right angles. Shunt lines 3 of the second row selection lines selected by the first row selection lines 1 and column selection lines 2 are formed above the memory cells by use of the second metal wiring layer. An insulation film 14 which is made flat is formed to cover the second metal wiring layer. Next, wirings of a third metal wiring layer of Al or the like are formed in parallel with the wirings of the second metal wiring layer on the flat surface of the insulation film 14 and first row selection lines 1 are formed in parallel with the wirings of the second metal wiring layer by use of the wirings of the third metal wiring layer. After this, the third metal wiring layer is covered with and protected by an insulation film (not shown). With the wiring structure on the semiconductor substrate, since the shunt lines 3 of the second row selection lines formed by use of the wirings of the second metal wiring layer are divided for each column of the memory cells, the wiring length thereof is short.

Further, since the first row selection lines 1 formed by use of the wirings of the third metal wiring layer above the second metal wiring layer are formed over the entire length of the memory cell array in the row direction thereof, the wiring length thereof is larger than the wiring length of the shunt line 3 of the second row selection line. In this embodiment, shunt lines 7 for lowering the resistance of the memory cell ground potential lines are formed by use of the wirings of the second metal wiring layer and the shunt line 7 is formed for each row. Thus, the wiring width Lc of the first row selection line 1 of the third metal wiring layer can be made larger than that of the conventional case while the wiring width Lb of the shunt line 3 of the second row selection line of the second metal wiring layer is kept unchanged. Conventionally, as shown in FIG. 4, for example, the shunt line 107 is formed over a boundary between the adjacent rows of memory cells and is commonly used for the two rows. Further, in this embodiment, the first row selection line 1 is formed so as to partly lie above the shunt line 3 like the second embodiment. That is, part of the first row selection line 1 is formed on that portion of the insulation film 14 which lies in a position deviated from the position directly above the shunt line 3 of the second row selection line so that the capacitance CM between the wirings can be made smaller and the Miller effect caused by setting the first row selection line 1 and the shunt line 3 in the inverted relation at the time of selection of the memory cell can be suppressed.

Next, a fourth embodiment is explained with reference to FIG. 14.

Figure 14:
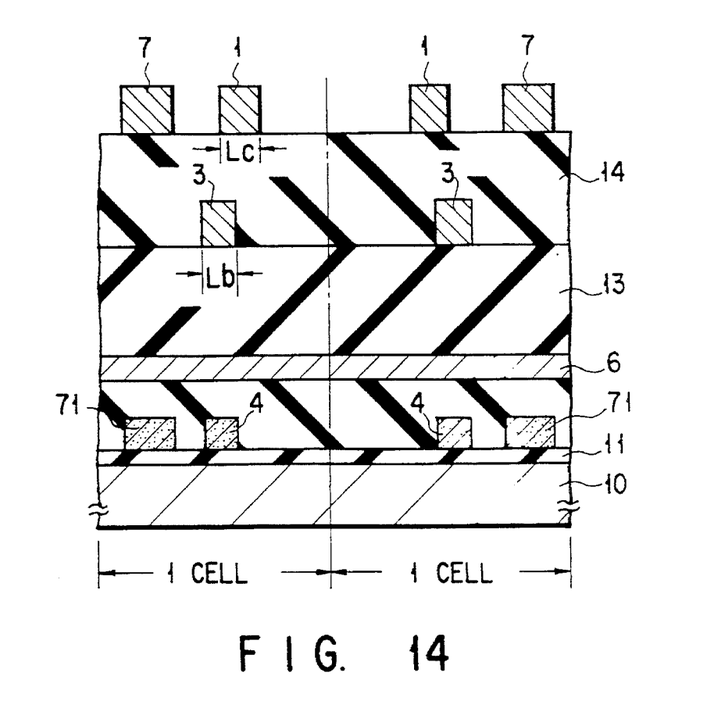
FIG. 14 is a cross sectional view of a semiconductor device according to a fourth embodiment of this invention.

FIG. 14 is a cross sectional view mainly showing the positional relation of the wirings of the SRAM on the semiconductor substrate according to this embodiment. The wiring structure on the semiconductor substrate 10 obtained by forming data lines 6 for transferring memory cell data by use of wirings of the first metal wiring layer of Al or the like and forming the insulation film 13 which is made flat to cover the data lines 6 is the same as that in the former three embodiments. The wiring structure is the same as that of the former embodiments in that the shunt line 7 is formed for each row. In this embodiment, the shunt line 7 is formed for each row by use of the wiring of the third metal wiring layer. The wiring width Lc of the first row selection line 1 of the third metal wiring layer can be made larger than that of the conventional case while the wiring width Lb of the shunt line 3 of the second row selection line of the second metal wiring layer is kept unchanged. Further, the first row selection line 1 is formed so as to partly lie above the shunt line 3 like the second and third embodiment. That is, the first row selection line 1 is formed on that portion of the insulation film 14 which lies in a position deviated from the position directly above the shunt line 3 of the second row selection line so that the capacitance CM between the wirings can be made smaller and the Miller effect caused by setting the first row selection line 1 and the shunt line 3 in the inverted relation at the time of selection of the memory cell can be suppressed.

Figure 15:
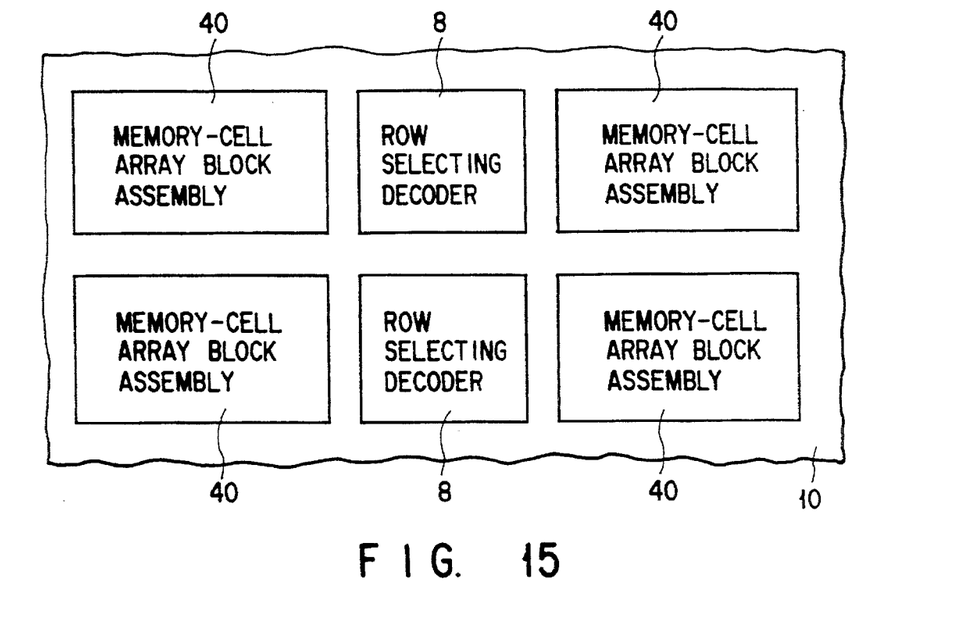
FIGS. 15 and 16 are diagrammatic plan views showing the arrangements of memory cells formed on the semiconductor substrate in this invention.
Figure 16:
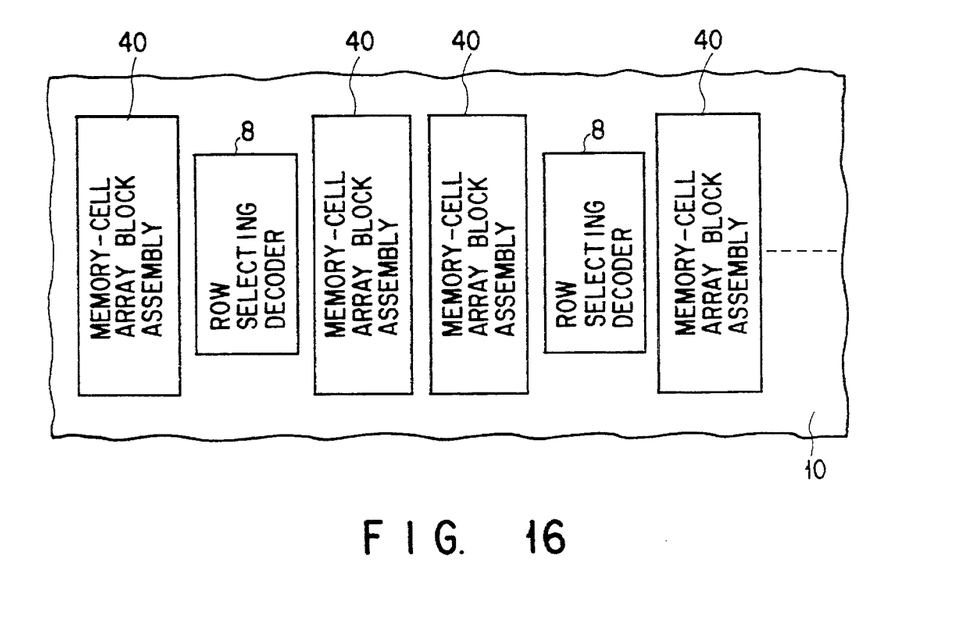

In the example of FIG. 9, a pair of assemblies of memory cell blocks and the row selection decoder are formed on the semiconductor substrate, but this invention is not limited to the semiconductor device of this structure. A semiconductor device of another structure of this invention is explained with reference to FIGS. 15 and 16. FIGS. 15 and 16 are diagrammatic plan views of the semiconductor devices. In a case of FIG. 15, each of row selection decoders 8 is used to control block assemblies 40 arranged on both sides thereof, i.e., the right and left sides thereof in FIG. 15. The row selection decoders are arranged in the upper and lower positions in the drawing on the semiconductor substrate 10. This invention is applied to the semiconductor device having the above memory, signal lines of larger wiring length, though not shown, are moved from a metal wiring layer in which a plurality of signal lines are arranged to another metal wiring layer which lies above or below the former metal wiring layer and the wiring width thereof is increased to effectively prevent an increase in the wiring delay time. Also, in a case of FIG. 16, each of the row selection decoders 8 is used to control block assemblies 40 arranged on both sides thereof, i.e., the right and left sides thereof in FIG. 16.

The row selection decoders are arranged linearly in a horizontal direction on the semiconductor substrate 10. This invention is applied to the semiconductor device having the above memory, and signal lines of larger wiring length are moved from a metal wiring layer in which a plurality of signal lines are arranged to another metal wiring layer which lies above or below the former metal wiring layer. Since the wiring length of the first row selection line can be reduced by reducing the number of memory cells in the block, an increase in the wiring delay time can be further effectively prevented in addition to the effect obtained by increasing the wiring width of the signal lines.

In the above embodiments, this invention is explained with reference to the semiconductor device including the memory, but this invention is not limited only to the memory and can be applied to various semiconductor devices such as logic circuits which require the high speed operation.

As described above, according to this invention, since wirings of large wiring length and wirings of wiring width larger than that of wirings of preset wiring width among a plurality of wirings of a preset metal wiring layer with the multi-layered wiring structure on the semiconductor substrate are formed on a metal wiring layer above or below the preset metal wiring layer so that the wiring resistance and the capacitance between the wirings can be reduced, the access time of the semiconductor device can be made short.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

a semiconductor substrate;

a plurality of memory cells formed on said semiconductor substrate;

first row selection lines formed over said semiconductor substrate, for transmitting a signal from a row selection decoder;

column selection lines formed over said semiconductor substrate, for transmitting a signal from a column selection decoder;

second row selection lines formed over said semiconductor substrate and connected to said plurality of memory cells;

shunt lines formed over said semiconductor substrate, for lowering the resistances of said second row selection lines;

an intermediate buffer for selecting one of said second row selection lines via a corresponding one of said shunt lines based on signals from said first row selection lines and said column selection lines;

a first metal wiring layer formed over said semiconductor substrate;

a second metal wiring layer formed over said first metal wiring layer with an insulation film disposed therebetween and having wirings used as at least said shunt lines of said second row selection lines; and a third metal wiring layer formed over said second metal wiring layer with an insulation film disposed therebetween and having wirings used as at least said first row selection lines; wherein the wiring width of said first row selection line is made larger than that of said shunt line of said second row selection line.

2. A semiconductor device according to claim 1, wherein said first metal wiring layer has wirings used as data lines for transmitting memory cell data.

3. A semiconductor device according to claim 1, wherein said second metal wiring layer has wirings of preset wiring width and said third metal wiring layer has wirings of wiring width larger than the wiring width of said wirings of the preset wiring width.

4. A semiconductor device according to claim 1, wherein the wiring length of said first row selection line is larger than the wiring length of said shunt line of said second row selection line.

5. A semiconductor device according to claim 1, wherein said shunt lines of said second row selection lines are deviated from each other in the upper and lower positions without disposing said first row selection line of said third metal wiring layer directly above said shunt line of said second row selection line of said second metal wiring layer.

6. A semiconductor device comprising:

a semiconductor substrate;

a plurality of memory cells formed on said semiconductor substrate;

first row selection lines formed over said semiconductor substrate, for transmitting a signal output from a row selection decoder;

column selection lines formed over said semiconductor substrate, for transmitting a signal from a column selection decoder;

second row selection lines formed over said semiconductor substrate and connected to said plurality of memory cells;

shunt lines formed over said semiconductor substrate, for lowering the wiring resistances of said second row selection lines;

an intermediate buffer for selecting one of said second row selection lines via a corresponding one of said shunt lines based on signals from said first row selection lines and said column selection lines;

a first metal wiring layer formed over said semiconductor substrate;

a second metal wiring layer formed over said first metal wiring layer with an insulation film disposed therebetween and having wirings used as at least said shunt lines of said second row selection lines; and a third metal wiring layer formed below said second metal wiring layer and above said first metal wiring layer with respective insulation films disposed therebetween and having wirings used as at least said first row selection lines;

wherein the wiring width of said first row selection line is larger than that of said shunt line of said second row selection line.

7. A semiconductor device comprising:

a semiconductor substrate;

first metal wiring layer formed over said semiconductor substrate and having first wirings of preset wiring length; and a second metal wiring layer formed above or below said first metal wiring layer and having second wirings of wiring length larger than that of said first wirings of the preset wiring length, said second wirings being substantially parallel to said first wirings of said first wiring layer; and a plurality of NOR decoders;

wherein wiring width of said second wirings of the second metal wiring layer is larger than that of said first wirings of preset wiring length of said first metal wiring layer, and wherein said second wirings are coupled to a plurality of said first wirings through said NOR decoders so that a plurality of said first wirings are coupled to a corresponding one of said second wirings when said one of said second wirings and a third wiring are selected.

8. A semiconductor device according to claim 7 further comprising a third layer of conductive wirings formed below said first metal wiring layer, wherein each of said first wirings is coupled to corresponding individual wirings of said third layer of conductive wirings and wherein said first wirings comprise aluminum and said third layer of conductive wirings comprises polysilicon.

* * * * *